(12) United States Patent
Mauritzson

(10) Patent No.: US 7,724,293 B2
(45) Date of Patent: May 25, 2010

(54) MULTI-PURPOSE IMAGE SENSOR CIRCUITS, IMAGER, SYSTEM AND METHOD OF OPERATION

(75) Inventor: Richard A. Mauritzson, Meridian, ID (US)

(73) Assignee: Aptina Imaging Corporation, George Town (KY)

( * ) Notice: Subject to any disclaimer, the term of this patent is extended or adjusted under 35 U.S.C. 154(b) by 483 days.

(21) Appl. No.: 11/717,436

(22) Filed: Mar. 12, 2007

(65) Prior Publication Data

US 2008/0225144 A1    Sep. 18, 2008

(51) Int. Cl.
H04N 3/14    (2006.01)
H04N 5/335    (2006.01)

(52) U.S. Cl. .................. 348/294; 348/300; 348/308
(58) Field of Classification Search .................. 348/294, 348/300, 308
See application file for complete search history.

(56) References Cited

U.S. PATENT DOCUMENTS

| | | | |
|---|---|---|---|
| 5,774,180 A * | 6/1998 | Abe et al. .................. 348/241 |
| 5,880,495 A | 3/1999 | Chen | |
| 5,903,021 A | 5/1999 | Lee et al. | |
| 5,904,493 A | 5/1999 | Lee et al. | |
| 6,297,070 B1 | 10/2001 | Lee et al. | |
| 6,410,899 B1 * | 6/2002 | Merrill et al. ............. 250/208.1 |

(Continued)

OTHER PUBLICATIONS

Lin et al., A four Transistor CMOS Active Pixel Sensor with High Dynamic Range Operation, 2004 IEEE Asia-Pacific Conference on Advanced System Integrated Circuits, Aug. 2004, pp. 124-127.

(Continued)

*Primary Examiner*—Lin Ye
*Assistant Examiner*—Amy Hsu
(74) *Attorney, Agent, or Firm*—David C. Kellogg

(57) ABSTRACT

Methods, devices, and systems for image sensors are disclosed that include a multi-mode circuit that can be configured for operating as an imaging pixel and a memory. The multi-mode circuit includes a photo-detector for collecting electrons generated by radiation impinging on the photo-detector. A transfer gate is configured for transferring the collected electrons from the photo-detector to a floating diffusion node when the transfer gate is enabled. A write circuit receives and stores a multi-value voltage on the floating diffusion node and a read circuit is configured for reading a state of the floating diffusion node. The state of the floating diffusion node corresponds to the amount of transferred electrons in an image mode or the multi-value voltage in a memory mode. The semiconductor image sensor may be included in as part of an imaging system that includes a memory for storing a digital representation of an image.

34 Claims, 8 Drawing Sheets

U.S. PATENT DOCUMENTS

| | | |
|---|---|---|
| 2004/0096124 A1 | 5/2004 | Nakamura |
| 2006/0125035 A1 | 6/2006 | Yaung |
| 2006/0197169 A1 | 9/2006 | Cole |
| 2006/0214201 A1 | 9/2006 | Rhodes |
| 2006/0255382 A1 | 11/2006 | Rhodes |
| 2008/0169414 A1* | 7/2008 | Li .................... 250/208.1 |
| 6,531,725 B2 | 3/2003 | Lee et al. |
| 6,794,214 B2 | 9/2004 | Berezin et al. |
| 6,897,082 B2 | 5/2005 | Rhodes et al. |
| 7,002,231 B2 | 2/2006 | Rhodes et al. |
| 7,009,227 B2 | 3/2006 | Patrick et al. |
| 7,071,505 B2 | 7/2006 | Rhodes |
| 7,091,059 B2 | 8/2006 | Rhodes |
| 7,091,536 B2 | 8/2006 | Rhodes et al. |
| 7,102,180 B2 | 9/2006 | Rhodes et al. |
| 7,110,030 B1* | 9/2006 | Kochi et al. .................. 348/308 |
| 7,515,186 B2* | 4/2009 | Moini et al. ................. 348/294 |
| 2004/0041150 A1 | 3/2004 | Jang et al. |

OTHER PUBLICATIONS

Nixon et al., 256×256 CMOS Active Pixel Sensor Camera-on-a-Chip, IEEE Journal of Solid State Circuits, vol. 31, No. 12, Dec. 1996, pp. 2046-2050.

Nixon et al., FA 11.1: 256×256 CMOS Active Pixel Sensor Camera-on-a-Chip, Center for Space Microelectronics Technology, Pasadene CA, 1996 IEEE International Solid State Circuits Conference, pp. 178, 179,and 440.

Fossum, Low Power Camera-on-a-Chip Using CMOS Active Pixel Sensor Technology, Center for Space Microelectronics Technology, Pasedena, CA, 1995 IEEE, pp. 74-77.

* cited by examiner

MULTI-PURPOSE IMAGE SENSOR CIRCUITS, IMAGER, SYSTEM AND METHOD OF OPERATION

FIELD OF THE INVENTION

Embodiments of the present invention relate to semiconductor devices. More particularly, embodiments of the present invention relate to complementary metal oxide semiconductor (CMOS) image sensors.

BACKGROUND OF THE INVENTION

Many systems include imaging devices to sense and capture optical images that can be electronically converted to a digital representation of the image. These image sensors include an array of photo-sensitive devices such as photodiodes, photo-transistors, photoconductors, or photogates, fabricated on, for example, a complementary metal oxide semiconductor (CMOS) device. The photo-sensitive devices are arranged as an array of pixel cells in a focal plane. Each photo-sensitive device is sensitive to light in such a way that it can create an electrical charge that is proportional to the intensity of light striking the photo-sensitive device. The overall image captured by an image sensor includes many pixels arranged in an array such that each pixel detects the light intensity at the location of that pixel.

Active pixel arrays are conventionally configured with the sensor element and additional circuitry. In many CMOS image sensors, this additional circuitry is generally configured to convert the charge accumulated on the photo-sensitive device to a voltage and possibly amplify or buffer that voltage for sensing.

In conventional implementations, the additional circuitry is dedicated to these tasks of conversion to a voltage, buffering, and amplifying.

BRIEF DESCRIPTION OF THE DRAWINGS

In the drawings, which illustrate embodiments of the invention.

DETAILED DESCRIPTION OF THE INVENTION

Figure 1:
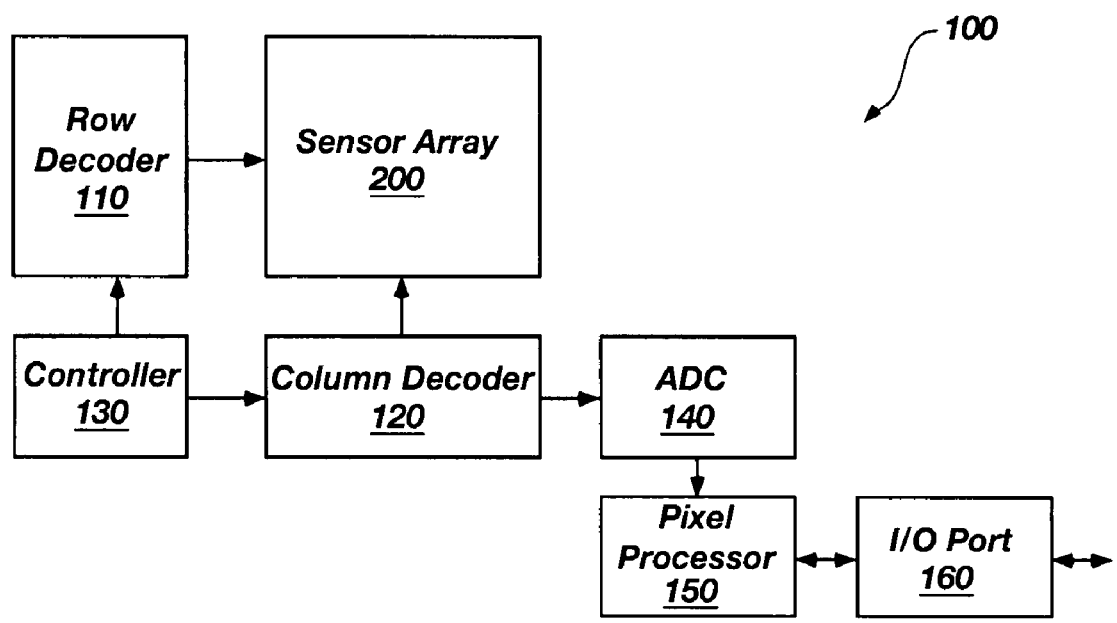
FIG. 1 is a simplified block diagram of a CMOS image sensor in accordance with an embodiment of the invention.

Embodiments of the present invention comprise methods, devices, and systems for image sensors that enable the image sensors, and the pixels in the image sensors, to perform new, memory functions in addition to the image sensing functions that they conventionally perform.

An embodiment of the present invention includes a multimode circuit that may be configured for operating as an imaging pixel and a memory. The multi-mode circuit includes a photo-detector configured for collecting electrons generated by a radiation impinging on the photo-detector. A transfer gate is configured for transferring the collected electrons from the photo-detector to a floating diffusion node when the transfer gate is enabled. A write circuit is configured for receiving and storing a multi-value voltage on the floating diffusion node and a read circuit is configured for reading a state of the floating diffusion node. The state of the floating diffusion node corresponds to the amount of transferred electrons in an image mode or the multi-value voltage in a memory mode.

Another embodiment of the present invention also includes a multi-mode circuit for operating as an imaging pixel and a memory. The multi-mode circuit includes a multi-value input configured for supplying at least two different voltage levels and a photodiode including an anode operably coupled to a substrate and a cathode. A transfer transistor is operably coupled between the cathode of the photodiode and a floating diffusion node with its gate operably coupled to a transfer input. An input transistor is operably coupled between the multi-value input and the floating diffusion node with its gate operably coupled to a write enable input. An output circuit includes a source follower transistor and an output transistor coupled in series between the multi-value input and an output node. A gate of the source follower transistor is coupled to the floating diffusion node and a gate of the output transistor is coupled to a read enable input.

Another embodiment of the present invention comprises a semiconductor device that includes an element array, a write buffer array, a write enable array, and a read enable array. The element array includes a plurality of pixels arranged in rows and columns. Each element is configured for sampling and storing an impinging radiation as an image state in an image mode and is further configured for storing a multi-value state in a memory mode. The write buffer array is coupled to the columns of the element array. In a memory mode, the write buffer array generates multi-value states to each column as an input to each pixel in the column. In an image mode, the write buffer array generates a supply voltage as the input to each pixel in the column. The write enable array is coupled to the rows of the element array and selects each pixel in a write-enabled row to receive either the multi-value state for the corresponding column in the memory mode or a reset state in the image mode. The read enable array is coupled to the rows of the element array and selects each pixel in a read-enabled row to read out a state of the pixel in the row, wherein the state is the image state in the image mode and the multi-value state in the memory mode.

Another embodiment of the present invention is a method of using an imaging pixel in multiple modes. The method includes operating the imaging pixel in a memory mode and operating the imaging pixel in an image mode. In the memory mode, the method includes writing a logic state to a floating diffusion node of the imaging pixel by providing a voltage level corresponding to the logic state on an input of the imaging pixel. In the memory mode, the method also includes reading the logic state of the floating diffusion node by enabling an output circuit. In the image mode, the method includes providing a supply voltage on the input signal, collecting electrons generated by a radiation impinging on a photo-detector of the imaging pixel, and transferring the collected electrons to the floating diffusion node. In the image mode, the method also includes reading an image state of the floating diffusion node by enabling the output circuit.

Yet another embodiment of the present invention, comprises an imaging system including a semiconductor imager and a memory operably coupled to the semiconductor imager. The memory is configured for storing a digital representation of an image captured by the semiconductor imager. The semiconductor imager includes a multi-mode circuit that can be configured for operating as an imaging pixel and a memory. The multi-mode circuit includes a photo-detector configured for collecting electrons generated by a radiation impinging on the photo-detector. A transfer gate is configured for transferring the collected electrons from the photo-detector to a floating diffusion node when the transfer gate is enabled. A write circuit is configured for receiving and storing a multi-value voltage on the floating diffusion node and a read circuit is configured for reading a state of the floating diffusion node. The state of the floating diffusion node corresponds to the amount of transferred electrons in an image mode or the multi-value voltage in a memory mode.

In the following detailed description, reference is made to the accompanying drawings which form a part hereof, and in which is shown by way of illustration specific embodiments in which the invention may be practiced. These embodiments are described in sufficient detail to enable those of ordinary skill in the art to practice the invention, and it is to be understood that other embodiments may be utilized, and that structural, logical, and electrical changes may be made within the scope of the present invention.

In this description, circuits and functions may be shown in block diagram form in order not to obscure the present invention in unnecessary detail. Conversely, specific circuit implementations shown and described are only examples and should not be construed as the only way to implement the present invention unless specified otherwise herein. Additionally, block definitions and partitioning of logic between various blocks are shown as an example implementation. It will be readily apparent to one of ordinary skill in the art that the present invention may be practiced by numerous other partitioning solutions. For the most part, details concerning timing considerations and the like have been omitted where such details are not necessary to obtain a complete understanding of the present invention and are within the abilities of persons of ordinary skill in the relevant art.

Some drawings may illustrate signals as a single signal for clarity of presentation and description. It will be understood by a person of ordinary skill in the art that the signal may represent a bus of signals, wherein the bus may have a variety of bit widths and the present invention may be implemented on any number of data signals including a single data signal. Furthermore, the terms "assert" and "negate" are respectively used when referring to the rendering of a signal, status bit, or similar apparatus into its logically true or logically false state. These logic states may not directly correspond to specific voltage levels on the signal. In other words, an asserted state may refer to a logic signal carrying a low voltage. Similarly, if the logically true state is a logic level one, the logically false state will be a logic level zero. Conversely, if the logically true state is a logic level zero, the logically false state will be a logic level one.

The terms "wafer" and "substrate" are to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in or over the base semiconductor structure or foundation. In addition, the semiconductor need not be silicon-based, but may be based on silicon-germanium, silicon-on-insulator, silicon-on-sapphire, germanium, or gallium arsenide, among others.

The term "pixel" refers to a picture element unit cell containing a photosensor and transistors for converting electromagnetic radiation to an electrical signal. For purposes of illustration, a representative pixel is illustrated in the figures and description herein and, typically, fabrication of all pixels in an imager will proceed simultaneously in a similar fashion. Embodiments of the present invention use a pixel in an image mode or a memory mode and may switch between modes, as is explained more fully below.

FIG. 1 is a simplified block diagram of a semiconductor imager 100 in accordance with an embodiment of the invention. The imager includes an element array 200 (which may also be referred to as a sensor array or an array of pixels), a row decoder 110, a column decoder 120, and a controller 130. The element array 200 includes photo-sensitive devices such as photodiodes, photo-transistors, photoconductors, and photogates fabricated on, for example, a complementary metal oxide semiconductor (CMOS) device. Each photo-sensitive device is sensitive to light in such a way that it can create an electrical charge that is proportional to the intensity of light striking the photo-sensitive device. The overall image captured by the element array 200 includes many pixels arranged in an array such that each pixel detects the light intensity at the location of that pixel.

As stated earlier, a single pixel may include a single photo-sensitive device configured for detecting a broad frequency range, which may be used for gray scale images. In addition, a pixel may be defined as a single photo-sensitive device configured for detecting a specific color (i.e., frequency). Finally, a pixel may be a group of photo-sensitive devices arranged near each other wherein different devices within the group are configured for detecting different colors. Thus, a full color image may be detected with an appropriate combination of color sensing pixels. The term pixel as used herein refers to a single photo-sensitive device for detecting a broad range of frequencies, a single photo-sensitive device for detecting a narrow frequency band, or a combination of photo-sensitive devices configured to capture a color image at the location of the pixel. The pixels of the element array 200 are arranged in individually addressable rows and columns such that the row decoder 110 can address each row of the element array 200 and the column decoder 120 can address each column of the element array 200. While not illustrated with connections, it will be understood by those of ordinary skill in the art that the controller 130 may control functions of many or all of the other blocks within the image sensor. For example, the controller 130 may control the exposure of the element array 200 (i.e., capturing an image) and the sequencing of the row decoder 110 and column decoder 120 to read out the analog values at each pixel location within the element array 200.

While not limited to a certain sequence, generally, the row decoder 110 selects a specific row and the column decoder 120 then receives every pixel in the selected row in parallel. The column decoder 120 can then sequence through each pixel within the selected row to determine the charge on each pixel.

As the pixels are each individually addressed, the resulting analog signal from each pixel may be sequentially directed from the column decoder 120 to an analog to digital converter 140. The analog to digital converter 140 converts the analog signal for each pixel to a digital signal representing the intensity of light at that pixel.

The digital signal for each pixel may be directed through a pixel processor 150. The pixel processor 150 may perform a number of functions on the pixel being processed. By way of example, and not limitation, if a pixel is identified as including an anomaly or defect, the value for the pixel may be replaced with a new value. For example, the value may be replaced by the value of a neighboring pixel or an average value from a number of neighboring pixels. In addition, other signal processing functions, such as, for example, filtering and compression may be performed by the pixel processor 150.

After processing, the current pixel may be transferred to an input/output (I/O) port 160 for transmission out of the semiconductor imager 100. The I/O port 160 may include storage to save up values from a number of pixels such that pixel values may be transferred out of the semiconductor imager 100 in a parallel or serial fashion.

Figure 2:
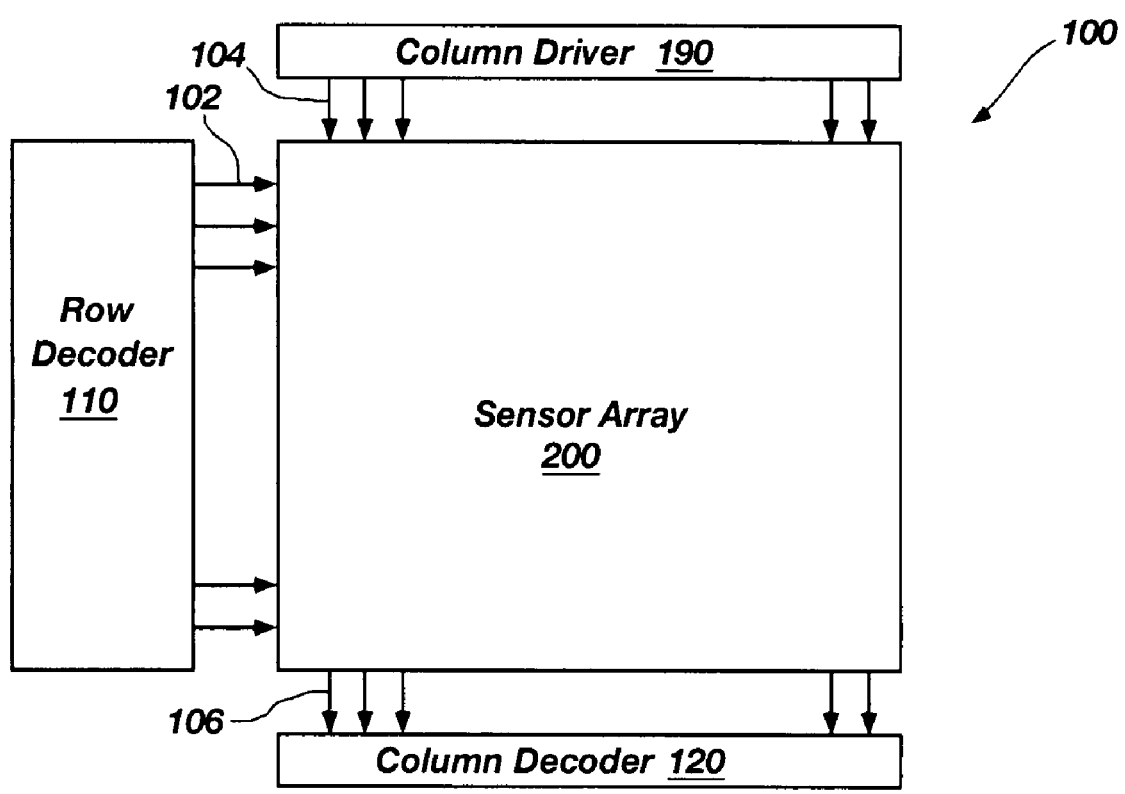
FIG. 2 is a simplified block diagram of a portion of a CMOS image sensor illustrating a sensor array with a row decoder, a column decoder, and a column driver.

FIG. 2 is a simplified block diagram of a portion of the CMOS image sensor. The row decoder 110 generates a set of control signals 102 for selecting and controlling each pixel within an individual row. Thus for any given row, all the pixels in that row receive the same set of control signals. For example, after an address to row decoding function, a write enable array may be used to generate a write enable signal for each row. Similarly, a read enable array may be used to generate a read-enable signal for each row and a transfer enable array may be used to generate a transfer signal for each row. Depending on the functional mode of the pixel sensors, the write-enable signal may be referred to as a reset signal and the read-enable signal may be referred to as a row select signal. Function of the control signal will become apparent in the discussion below of the pixel circuit in FIG. 4. The column decoder 120 senses column output signals 106 for each column, wherein each column has its own sensor. Details of a possible embodiment of a column decoder 120 are discussed more fully below when discussing FIG. 8.

Embodiments of the present invention include a column driver 190, which need not be present in CMOS image sensors in a conventional configuration. The column driver 190 includes a write buffer array with a separate driver for each column within the sensor array 200. Thus, each column input 104 may be independently driven to a different voltage level.

Figure 3:
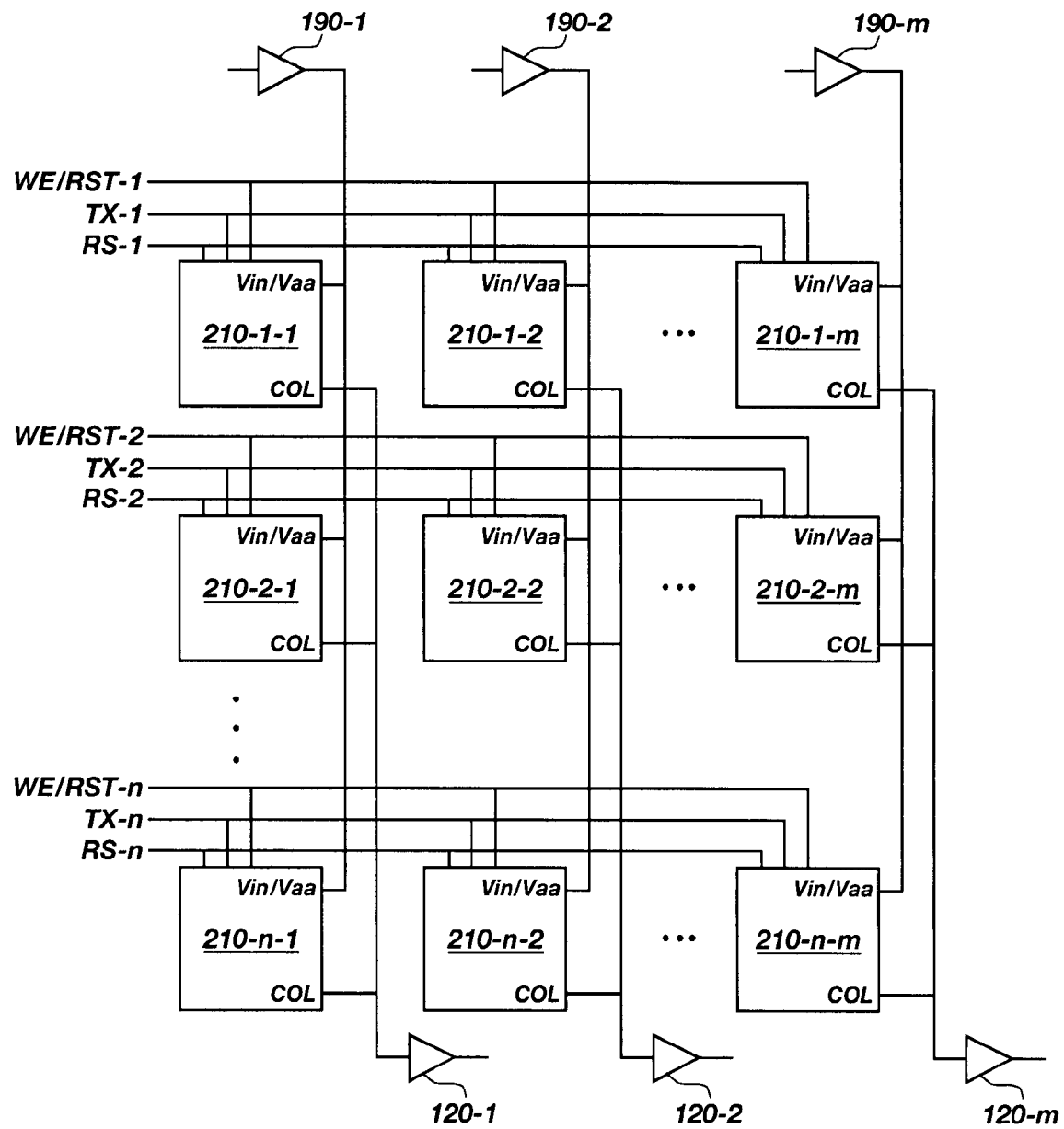
FIG. 3 is a simplified block diagram illustrating multiple pixel sensors as a portion of the sensor array.

FIG. 3 shows details of the sensor array 200, column drivers 190, and column decoders 120 from FIG. 2. Each row includes a write enable signal (We/RST-1, We/RST-2, We/RST-n), a transfer signal (TX-1, TX-2, TX-n), and a row select signal (RS-1, RS-2, RS-n). Generally, the row decoder 110 (FIG. 2) may select one row for any given operation. During that specific operation, the signals for unselected rows will remain negated while the write enable signal, transfer signal, and row select signal for the selected row may be asserted as is explained more fully below with reference to the timing diagrams in FIGS. 6 and 7.

The write buffer array includes a write buffer (190-1, 190-2, 190-n) for each column in the array. Thus, each column may receive an independent voltage level on the Vin/Vaa inputs of the pixel sensors (210-1-1 through 210-n-m) intended for that specific column. The column decoder 120 includes a column sensor (120-1, 120-2, 120-m) for each column in the array. Thus, each column sensor can sense a voltage value presented on the column output from a selected pixel sensor 210.

Figure 4:
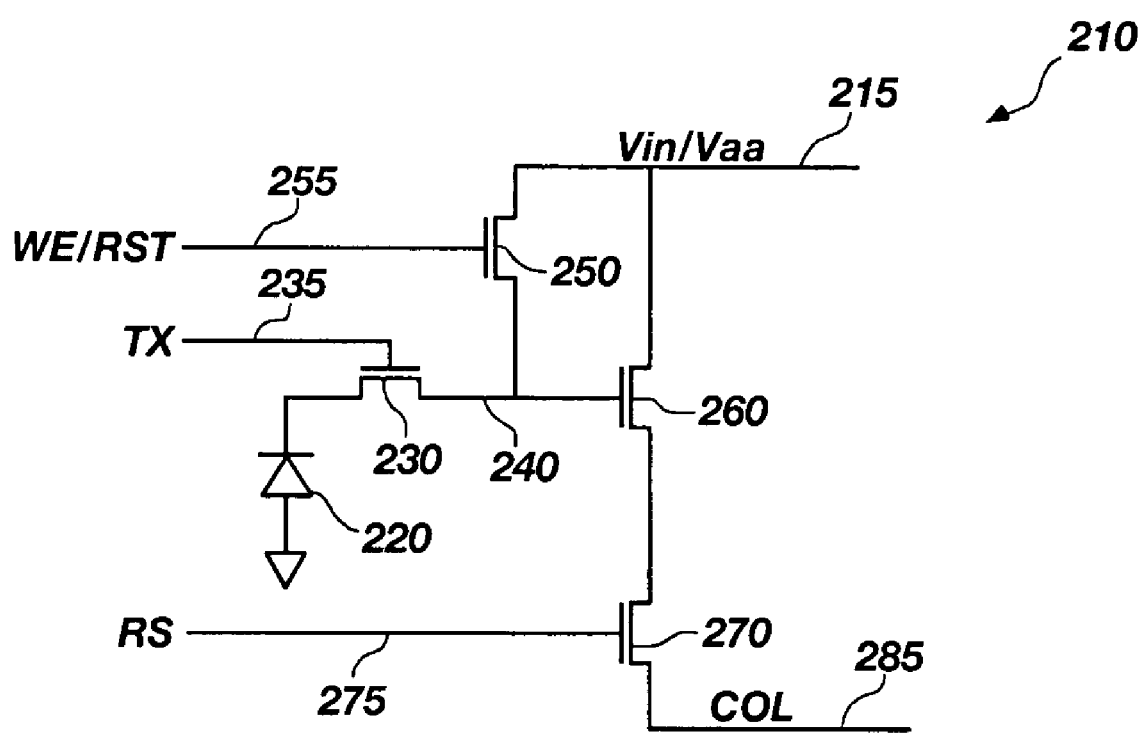
FIG. 4 is a circuit diagram of a pixel sensor in accordance with an embodiment of the invention.
Figure 5A:
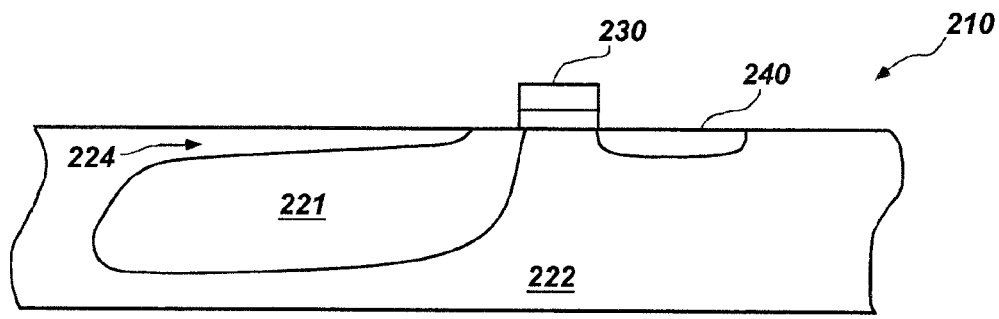
FIG. 5A is a cross-sectional view of a portion of a pixel sensor.

FIG. 4 is a circuit diagram of a pixel sensor 210 in accordance with an embodiment of the invention and FIG. 5A is a cross section of a portion of the pixel sensor 210. Those of ordinary skill in the art will recognize that the present invention may be practiced with a wide variety of pixel structures other than the one illustrated in FIGS. 4 and 5A and may include devices not shown, such as, for example resistors, capacitors, photoconductors, phototransistors and photogates. The pixel sensor 210 includes a photodiode 220, a transfer transistor or gate 230, a floating diffusion region or node 240, an input transistor 250, a source follower transistor 260, and a row select transistor 270. The source follower transistor 260 and row select transistor 270 may be collectively referred to as an output circuit.

The photodiode 220 may be a pinned photodiode. As illustrated in FIG. 5A, pinned photodiodes 220 may be used in embodiments of the present invention by creating the photodiode 220 between a p-type substrate 222, an n-type implant layer 221 and a p-type surface area 224. The p-type surface area pins the potential of the surface to the potential of the substrate, which typically is a ground potential. This pinning suppresses dark current generation and enables electrons generated during an integration phase to be fully depleted to the floating diffusion during a transfer stage.

Returning to FIG. 4, the column input enters the pixel sensor 210 as an input signal 215 labeled Vin/Vaa. The input signal 215 is coupled to the source nodes of the input transistor 250 and the source follower transistor 260. A conventional image sensor differs from embodiments of the present invention in that it does not include an input signal 215. Rather the signal that is described as the input signal 215 (i.e., the signal coupled to the sources of the input transistor 250 and the source follower transistor 260) would be coupled to a voltage source, which is typically referred to as Vaa. As a result, in a conventional image sensor, every pixel receives the same Vaa voltage source and that voltage source that maintains a constant value. Therefore, there is no need for a column input signal 215 or a column driver to drive the column input signal 215. In addition, the conventional Vaa may be routed to the pixel sensors 210 in a number of different arrangements along rows or columns.

By adding column drivers and a column input signal 215 that may be set to multiple voltage levels, the pixel sensor 210 may be used in its conventional image sensing mode and also may be used as a memory to store logic states.

Figure 5B:
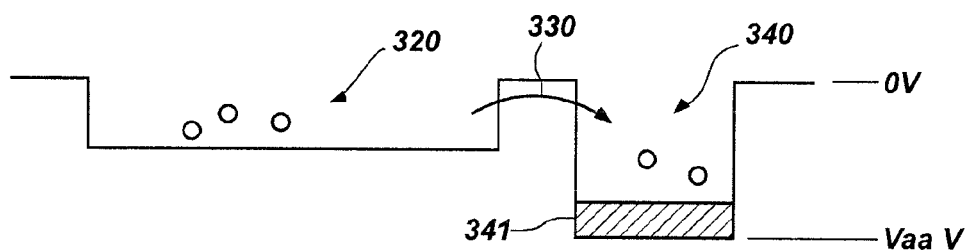
FIG. 5B is an electrostatic potential diagram illustrating charge accumulation and transfer for the pixel sensor of FIG. 5A in an image mode.
Figure 5C:
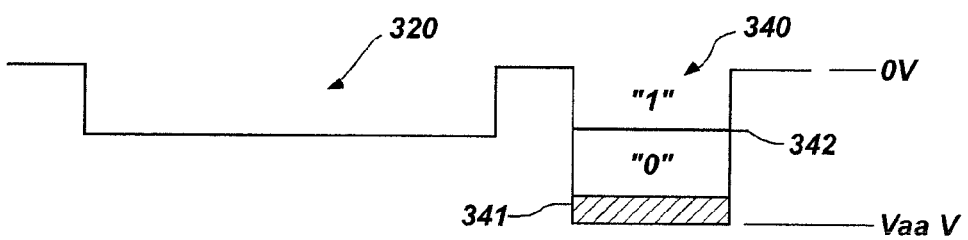
FIG. 5C is an electrostatic potential diagram illustrating possible charge states for the pixel sensor of FIG. 5A in a memory mode.
Figure 5D:
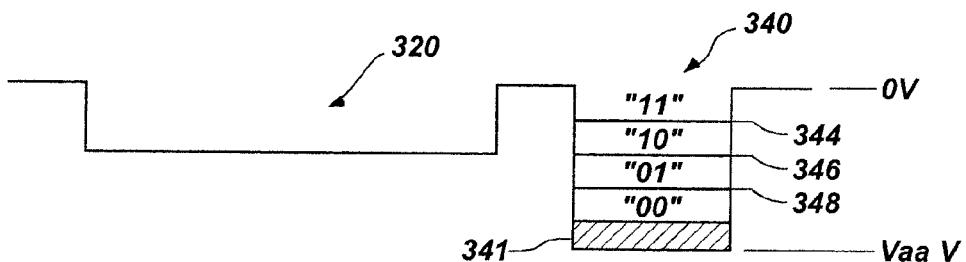
FIG. 5D is an electrostatic potential diagram illustrating possible charge states for the pixel sensor of FIG. 5A in another memory mode.

Operation of the pixel sensor 210 will be described in both the image mode and the memory mode and with reference to FIG. 4 and FIGS. 5A-5D. FIG. 5A is a cross-sectional view of a portion of a pixel sensor 210. FIG. 5B is an electrostatic potential diagram illustrating charge transfer for the pixel sensor 210 of FIG. 5A in the image mode. FIGS. 5C and 5D are electrostatic potential diagrams illustrating possible charge states for the pixel sensor 210 of FIG. 5A in memory modes. In FIG. 5A, a cross section of the photodiode 220, transfer gate 230, and floating diffusion node 240 are illustrated.

The electrostatic potential diagrams of FIGS. 5B-5D illustrate photodiode wells 320 for accumulating charge in the photodiode region corresponding to the photodiode 220 of FIG. 5A and floating diffusion wells 340 corresponding to the floating diffusion node 240 of FIG. 5A. In FIG. 5B, the floating diffusion well 340 is reset to make the well as deep as possible by applying the highest potential (i.e., Vaa) through the input transistor 250 and onto the floating diffusion node 240. This reset potential may also be referred to as a reference image state, a reset state, or a dark image state. During integration, electrons accumulate in the photodiode well 320. When the transfer gate 230 is turned on, the "on" potential of the transfer gate 230 lowers, allowing the electrons from the photodiode well 320 to transfer 330 across the transfer gate 230 and accumulate in the floating diffusion well 340. The bottom region 341 of the floating diffusion well 340 illustrates that the depth of the well may creep up over time due to dark current leakage and other phenomena that may contribute electrons to the floating diffusion well 340.

In the image mode, and referring to FIG. 4, the input signal 215 is driven by the column driver 190 (shown in FIG. 2) to the source voltage potential generally referred to as Vaa, as was discussed earlier. Thus, when the input signal 215 is driven to and held at Vaa, the image sensor operates as a conventional image sensor. The input transistor 250 may be enabled by asserting a write enable input 255 (WE/RST) to place the floating diffusion region 240 to a known potential, such as substantially near the potential of the Vaa voltage source. The transfer transistor 230 may also be enabled by asserting a transfer input signal 235 (TX) during the period while the write enable input 255 is asserted to clear out any residual charge in the photodiode 220 fully resetting the photodiode 220 to its pinned potential. Thus, in image mode, the write enable input 255 functions as the conventional reset input and the input signal 215 functions as the conventional Vaa signal. Before, during, or after initializing the floating diffusion region 240, the photodiode 220, or combination thereof, the photodiode 220 may be exposed to light to convert photons to electrons in the photodiode 220. The transfer transistor 230 is enabled by asserting the transfer input signal 235 to transfer the charge collected by the photodiode 220 onto the floating diffusion region 240. The floating diffusion region 240 is coupled to the gate of the source follower transistor 260 such that the charge on the floating diffusion region 240 is converted to a signal at the drain of the source follower transistor 260, wherein the signal is proportional to the charge on the floating diffusion region 240. The row select transistor 270 may be enabled by asserting a row select input (may also be referred to as a read enable input), allowing the signal at the drain of the source follower transistor 260 to be presented on the column output signal 285. Correlated Double Sampling (CDS) may also be incorporated by resetting the floating diffusion node 240 just prior to enabling the transfer input signal 235 and sampling the "reset" level on the column output for a difference comparison to the sampled "signal" level. CDS is explained more fully below in reference to FIG. 8.

In the memory mode, the photodiode 220 and transfer gate 230 are not used and the transfer input signal 235 is left negated. Logic states may be stored on the floating diffusion node 240. To write a logic state to the floating diffusion node 240, a voltage value is placed on the input signal 215 (also may be referred to as a multi-value input). For example, a voltage substantially near ground may be placed on the input signal 215 to represent a "1" and a voltage substantially near Vaa may be placed on the input signal 215 to represent a "0." Asserting the write-enable signal enables the input transistor 250 to drive the input signal 215 onto the floating diffusion node 240. Thus, in memory mode, the write enable input 255 functions as the signal to enable writing data to the pixel sensor and the input signal 215 functions as the data input signal 215. Reading in memory mode is similar to reading in image mode. The floating diffusion region 240 is coupled to the gate of the source follower transistor 260 such that the charge on the floating diffusion region 240 is converted to a signal at the drain of the source follower transistor 260, wherein the signal is proportional to the charge on the floating diffusion region 240. The row select transistor 270 may be enabled by asserting a row select input 275, allowing the signal at the drain of the source follower transistor 260 to be presented on the column output signal 285.

When operating in image mode, the value read out on the column output signal 285 is an analog voltage (may also be referred to as an image state) that is proportional to the number of photons impinging on the photodiode 220 during the integration phase. This analog voltage is sensed by the column sensor and may be converted to a digital value by an analog to digital converter. By way of example, if the analog to digital converter is 10 bits wide, the output of the pixel sensor may be interpreted as 1024 different discrete levels. 10 bits is an example used throughout this discussion for consistency and ease of description. Of course, the analog to digital converter may be implemented in other bit widths.

The analog to digital converter may be taken advantage of in memory mode by providing a means of detecting multiple states of charge on the floating diffusion that may be interpreted as different logic values. Thus, in memory mode and at the most extreme for a 10 bit analog to digital converter, 1024 different logic states could be read out of each pixel sensor.

FIGS. 5C and 5D in combination with FIG. 5A illustrate how multiple logic states may be represented by a multi-value state stored on the floating diffusion node 240. In FIG. 5C, line 342 illustrates a threshold value. If the floating diffusion node 240 is charged to a voltage below this threshold (i.e., a charge state higher than the threshold in the electrostatic potential diagram) the value read out may be interpreted as a "1." If the floating diffusion node 240 is charged to a voltage above this threshold (i.e., a charge state lower than the threshold in the electrostatic potential diagram) the value read out may be interpreted as a "0." By way of example, and not limitation, if the highest voltage the floating diffusion node 240 may be charged to is 2.8 volts, the threshold may be defined as about 1.4 volts. With this threshold, any value read out with a voltage above 1.4 volts would be interpreted as a "0" and any value read out with a voltage below 1.4 volts would be interpreted as a "1."

This threshold is an arbitrary value that may be interpreted after the analog to digital converter. For example, the analog to digital converter may produce a digital value from 0 to 1023, corresponding to 0 volts to 2.8 volts. The threshold may be set by hardware, or software, to interpret the resultant digital value as a one or a zero. Thus, if the threshold is set at 500, a digital value of 15 would be interpreted as a "1" and a digital value of 950 would be interpreted as a "0." As stated earlier, the charge in the floating diffusion well 340 may creep up over time after it has been written to, due to electron leakage into the well. Thus, it may be advantageous to set the threshold at a value that compensates for this possible leakage. As a result, the threshold may be set at different values for different imager devices depending on test results indicating the amount of leakage that may occur for that particular device.

Of course, to allow as much margin as possible, the voltage levels written into the floating diffusion node 240 from the column driver, via the input transistor, would be set at the highest and lowest limits available. In other words, to write a "1," the column driver would supply a voltage substantially near ground and to write a "0," the column driver would supply a voltage substantially near a voltage supply, such as Vaa.

FIG. 5D illustrates a multi-value state of four different digital values that may be stored on the floating diffusion. In this arrangement, a voltage below line 344 may be interpreted as "11," a voltage between line 344 and 346 may be interpreted as "10," a voltage between line 346 and 348 may be interpreted as "01," and a voltage above line 348 may be interpreted as "00." Thus, after the voltage value is read, and converted to a digital output representing the voltage level, the digital output can be interpreted as one of the four digital values. By way of example, and not limitation, after the analog to digital converter, digital values below 200 may be interpreted as "11," digital values between 200 and 400 may be interpreted as "10," digital values between 400 and 600 may be interpreted as "01," and digital values above 600 may be interpreted as "00."

One very simple way to interpret the digital output from the analog to digital converter as the value of the memory state would be to simply use only the most significant bits of the digital output. For example, for a two-state embodiment, the most significant bit would indicate the memory state. Similarly, for a four-state embodiment, the two most significant bits would indicate the memory state and for an eight-state embodiment, the three most significant bits would indicate the memory state.

Figure 6:
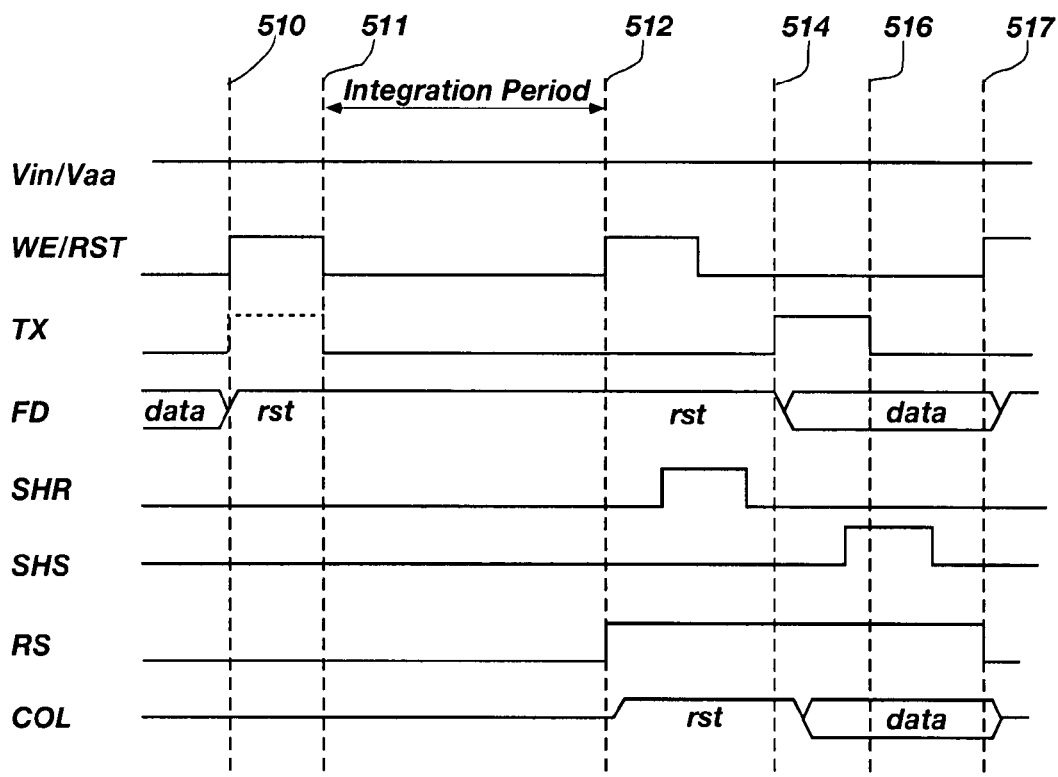
FIG. 6 is a timing diagram illustrating a possible sequence for operating the pixel sensor of FIG. 4 in a sensing mode.
Figure 7:
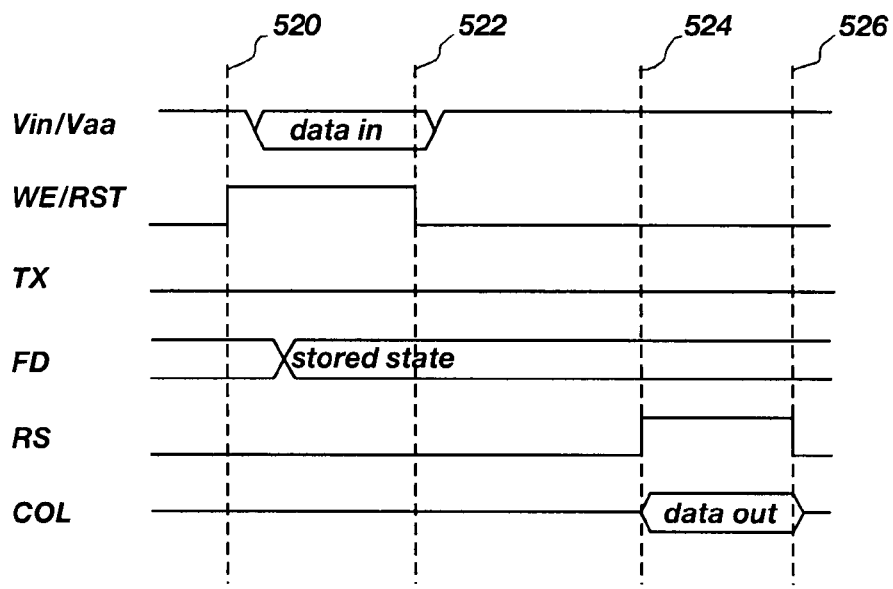
FIG. 7 is a timing diagram illustrating a possible sequence for operating the pixel sensor of FIG. 4 in a memory mode.

FIGS. 6 and 7 illustrate example timing diagrams that may be used for operating the pixel sensor in the image mode and memory mode respectively. These timing diagrams are used to illustrate a possible timing sequence that may be used for operating the pixel sensor in the image mode and the memory mode. Those of ordinary skill in the art will recognize that the pixel sensor may operate in accordance with the present invention with other suitable timing sequences.

In the image mode, as illustrated in FIG. 6, the Vin/Vaa input signal is held to the supply voltage value Vaa. At time 510, the WE/RST signal, which is performing a reset function in image mode, is asserted and the TX signal may be negated, or, if the photodiode is to be reset, the TX signal may be asserted. This causes the floating diffusion node (FD) to be held to a reset value substantially near Vaa and if the TX signal is asserted it causes the photodiode to be reset to its pinned potential. At time 512, the RS signal and WE/RST signal are asserted. While the RS signal is asserted and after the WE/RST signal is negated, the column output (COL) represents the reset value of the floating diffusion node. At time 514, the TX signal is asserted and any charge on the photodiode is transferred to the floating diffusion node. With the RS signal still asserted, the column output will switch to represent the charge on the floating diffusion node that was transferred from the photodiode. At time 516, the TX signal is negated stopping any further transfer of charge from the photodiode to the floating diffusion node. At time 517, the RS signal is negated and the cycle of image integration and charge read-out is complete. The SHR signal (Sample and Hold Reset) is asserted while the RS signal is asserted and the reset value is on the floating diffusion node to read out a reset value on the column output. The SHS signal (Sample and Hold Signal) is asserted while the RS signal is asserted and the data is valid on the floating diffusion node to read out a data value on the column output. Reading out a reset value and a data value on the column output allows for more accurate sensing by using a differential amplifier in the column sensors, as is explained more fully below in the discussion of FIG. 8.

In the memory mode, as illustrated in FIG. 7, the Vin/Vaa input signal may be modified to carry a specific voltage representing a given data value, or logic state, during a write phase to the pixel sensor. The write phase may begin at time 520 by asserting the WE/RST signal, which functions as a write enable during memory mode. The desired voltage level is placed on the Vin/Vaa signal, which then passes to the floating diffusion node (FD). With the desired voltage level at the floating diffusion node, the WE/RST signal is negated at time 522, latching the voltage level into the floating diffusion node. Some time later, the stored state on the floating diffusion node may be read by a read phase. The read phase begins at time 524 by asserting the row select signal (RS). The voltage representing the value on the floating diffusion node is driven onto the column output signal (COL) by an output circuit. The output circuit includes the source follower transistor 260 and row select transistor 270, as illustrated in FIG. 4. At time 526, the row select signal is negated, returning the column output signal to a high impedance state.

Figure 8:
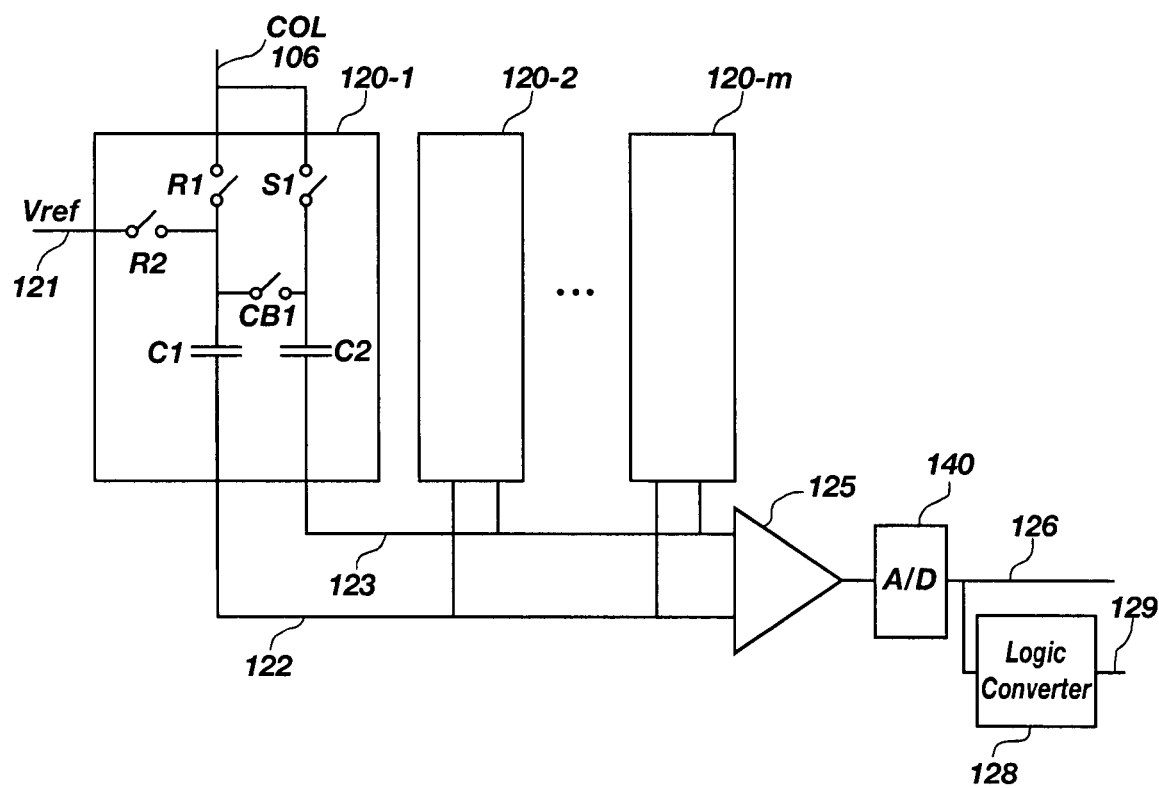
FIG. 8 is a simplified circuit diagram of a column sensor that may be used in accordance with an embodiment of the invention.

Sensing the column output signal may be performed in a number of different ways in image sensors. FIG. 8 is a simplified circuit diagram of a column sensor that may be used in accordance with an embodiment of the invention. The column sensor is implemented with a differential amplifier 125. Sampling capacitors (CIN1 and CIN2) are coupled to inputs of the amplifier 125. Input switches R1 and S1 couple the column signal 106 to the other side of sampling capacitors CIN1 and CIN2, respectively. A crowbar switch CB1 is coupled between the reset capacitor C1 and the sense capacitor C2.

In the image mode, a pixel in the column is sensed by first sensing a reset value for the pixel, then sensing an integration value for the pixel. Referring to FIG. 8 and FIG. 6, during the time period between time 512 and 514 (FIG. 6) the reset value is placed on the column output. Reset switch R1 is closed, sense switch S1 is open, and crowbar switch CB1 is open during this time to charge reset capacitor C1 to a voltage representing the reset value on the column output. During the time period between time 514 and 517 (FIG. 6) the integration value is placed on the column output. Reset switch R1 is open, sense switch S1 is closed, and crowbar switch CB1 is open during this time to charge sense capacitor C2 to a voltage representing the integration value or signal value (i.e., image state) on the column output. After the reset capacitor C1 and sense capacitor C2 are properly charged, the difference between the charges on the two capacitors may be placed on signals 122 and 123 by closing the crowbar switch CB1 while reset switch R1 and sense switch S1 are open. Differential amplifier 125 amplifies this difference in charge. The result from the differential amplifier 125 then may be converted to a digital output 126 by the analog to digital converter 140. This method of comparing the signal level to the reset level is commonly referred to as Correlated Double Sampling (CDS).

In memory mode, there is not a reset phase and only the memory state is read out during a read phase. However, the differential amplifier configuration of FIG. 8 may still be used by adding a reference voltage 121 and a second reset switch R2. By way of example, and not limitation, the reference voltage 121 may be set to ground. For a memory read operation, reset switch R1 is always left open. Referring to FIG. 8 and FIG. 7, during the time period between time 520 and 524 (FIG. 7) the second reset switch R2 is closed, sense switch S1 is open, and crowbar switch CB1 is open to use the reference voltage 121 to charge reset capacitor C1 to a voltage representing the reference voltage. During the time period between time 524 and 526 (FIG. 7) the memory state value is placed on the column output. Second reset switch R2 is open, sense switch S1 is closed, and crowbar switch CB1 is open to charge sense capacitor C2 to a voltage representing the memory state on the column output. After the reset capacitor C1 and sense capacitor C2 are properly charged, the difference between the charges on the two capacitors may be placed on signals 122 and 123 by closing the crowbar switch CB1 while second reset switch R2 and sense switch S1 are open. Differential amplifier 125 amplifies this difference in charge. The result from the differential amplifier 125 then may be converted to a digital output 126 by the analog to digital converter 140. A logic converter 128 may be coupled to the digital output for converting the digital output to the possible logic states that may be stored in the pixel sensor when it is in a memory mode, as was discussed previously with reference to FIGS. 5C and 5D. The logic converter 128 may generate one or more logic bits 129 depending on the number of logic states stored in the pixel sensor.

The reading operation, whether for memory mode or image mode, is repeated for each column in the column decoder (i.e., 120-1, 120-2, 120-m). The switches illustrated in FIG. 8 may be formed in any suitable means. For example, the switches may be implemented as n-channel transistors, p-channel transistors, or combinations thereof.

It should be noted that the pixel array may operate in memory mode and image mode substantially simultaneously. Rows of the array not being actively used for reset or readout of the photodiode can be used to store and readout logic values on the floating diffusion node. This memory function may occur during photodiode integration (i.e., between times 511 and 512 in FIG. 6).

Those of ordinary skill in the art will recognize that there are many ways to sense the output columns from the pixel arrays. The column sensor embodiment shown in FIG. 8 is a simplified version of a column sensor and is shown and discussed as one possible implementation to illustrate changes to the column sensor that may be used to adapt it for the memory mode while still being useable in the image mode. By way of example, some column sensors may not utilize the differential sensing mechanism of sensing a reset voltage and an image voltage. In an embodiment that does not use differential sensing, it may not be necessary to provide any additional circuitry to support a memory mode and the sensed value may go directly to an analog to digital converter. In those types of column sensors, the result from the analog to digital converter would just be used differently in the memory mode than it is in the image mode.

Figure 9:
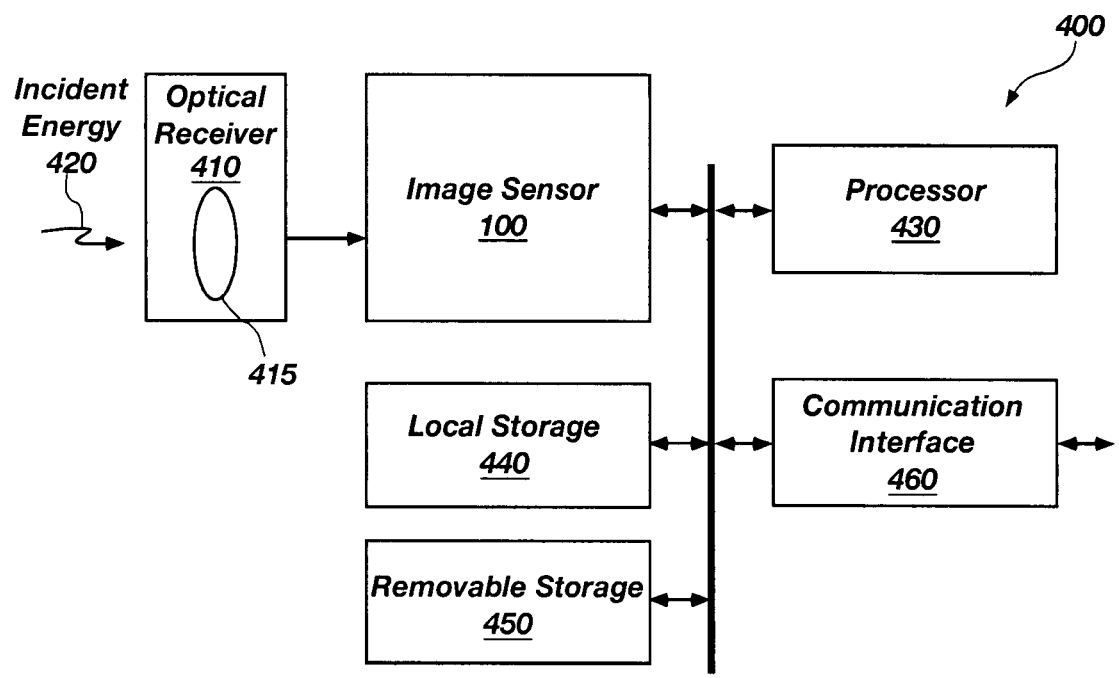
FIG. 9 is a simplified imaging system block diagram including an image sensor formed according to embodiments of the present invention.

FIG. 9 illustrates an imaging system 400 including a semiconductor imager 100 containing embodiments according to the present invention. The imaging system 400 includes a processor 430 for receiving and modifying digital representations of images from the semiconductor imager 100. The imaging system 400 may also include an optical receiver 410 for channeling, focusing, or modifying incident energy 420, being visible light in one case, to present an optical image to the image sensor. For example, the optical receiver 410 may include a lens 415 for focusing the incident energy 420 onto the semiconductor imager 100.

The imaging system 400 may include a communication interface 460 for transmitting and receiving data and control information. Finally, the imaging system 400 may include memory (440 and 450) in the form of local storage 440 and removable storage 450, such as, for example, Flash memory, magnetic recording media and optical recording media.

Without being limiting, such an imaging system 400 may include systems such as a computer system, camera system, scanner, machine vision, videophone, surveillance system, auto focus system, image stabilization system, and data compression system.

Although the present invention has been described with reference to particular embodiments, the present invention is not limited to these described embodiments. Rather, the present invention is limited only by the appended claims, which include within their scope all equivalent devices or methods that operate according to the principles of the present invention as described.

What is claimed is:

1. A multi-mode circuit operable as an imaging pixel and a memory, the circuit comprising:
   a photo-detector to collect electrons generated by radiation impinging thereon;
   a transfer gate to transfer the collected electrons to a floating diffusion node;
   a write circuit to store a multi-value voltage on the floating diffusion node; and
   a read circuit that reads the transferred electrons during an image mode and that reads the stored multi-value voltage during a memory mode, wherein the write circuit stores a ground voltage to represent a first logic value when operating in the memory mode and stores a positive voltage to represent a second logic value that is different from the first logic value when operating in the memory mode.

2. The multi-mode circuit of claim 1, wherein the photo-detector is selected from the group consisting of a photodiode, a photoconductor, a photogate, a transistor, and a capacitor.

3. The multi-mode circuit of claim 1, wherein the multi-value voltage received by the write circuit is configured to maintain a supply voltage when the multi-mode circuit is operating in the image mode.

4. The multi-mode circuit of claim 1, wherein the multi-value voltage received by the write circuit is configured to supply more than two different voltage levels to represent a corresponding more than two different logic states when the multi-mode circuit is operating in the memory mode.

5. The multi-mode circuit of claim 1, further comprising a read buffer configured to sample the output signal and convert the sampled value to a digital value representing a voltage on the output signal.

6. The multi-mode circuit of claim 1, further comprising a write buffer operably coupled to the write circuit and configured to drive the multi-value voltage.

7. A multi-mode circuit operable as an imaging pixel and a memory, the circuit comprising:
   a multi-value input configured for supplying at least two different voltage levels including a ground voltage and a positive power supply voltage;
   a photodiode including an anode operably coupled to a substrate and a cathode;
   a transfer transistor operably coupled between the cathode of the photodiode and a floating diffusion node with its gate operably coupled to a transfer input;
   an input transistor operably coupled between the multi-value input and the floating diffusion node with its gate operably coupled to a write enable input; and
   an output circuit comprising a source follower transistor and an output transistor operably coupled in series between the multi-value input and an output node, wherein a gate of the source follower transistor is operably coupled to the floating diffusion node and a gate of the output transistor is operably coupled to a read enable input.

8. The multi-mode circuit of claim 7, wherein the multi-value input is configured to maintain a supply voltage when the multi-mode circuit is operating in an image mode.

9. The multi-mode circuit of claim 7, wherein the multi-value input is configured to supply more than two different voltage levels to represent a corresponding more than two different logic states when the multi-mode circuit is operating in a memory mode.

10. The multi-mode circuit of claim 7, further comprising a read buffer configured to sample the output node and convert the sampled value to a digital value representing a voltage on the output node.

11. The multi-mode circuit of claim 7, further comprising a write buffer operably coupled to the multi-value input and configured to drive the multi-value input to the at least two different voltage levels.

12. A semiconductor imager, comprising:
an element array comprising a plurality of pixels arranged in rows and columns, each pixel configured for storing impinging radiation as an image state in an image mode and for storing a multi-value state in a memory mode;
a write buffer array to generate multi-value states to each column as an input to each pixel in the column while in the memory mode and generating a supply voltage as the input to each pixel in a column while in the image mode, wherein the multi-value states generated by the write buffer array include ground voltages that represent a first logic state and positive voltages that represent a second logic state that is distinct from the first logic state;
a write enable array to select each pixel in a write-enabled row to receive the multi-value state in the memory mode and setting a reset state of each pixel in the write-enabled row in the image mode; and
a read enable array to select each pixel in a read-enabled row to read out a state of the pixel in the row, wherein the state is the image state in the image mode and the multi-value state in the memory mode.

13. The semiconductor imager of claim 12, wherein each pixel of the plurality of pixels comprises:
a photo-detector configured for collecting electrons generated by a radiation impinging thereon;
a transfer gate configured for transferring the collected electrons from the photo-detector to a floating diffusion node when the transfer gate is enabled;
a write circuit configured for receiving and storing the multi-value state on the floating diffusion node; and
a read circuit configured for reading a state of the floating diffusion node and generating an output signal representing the state, wherein the state corresponds to the amount of transferred electrons in the image mode or the multi-value state in the memory mode.

14. The semiconductor imager of claim 13, wherein the photo-detector is selected from the group consisting of a photodiode, a photoconductor, a photogate, a transistor, and a capacitor.

15. The semiconductor imager of claim 13, wherein the multi-value states are generated by the write buffer array as more than two different voltage levels to represent a corresponding more than two different logic states when operating in the memory mode.

16. The semiconductor imager of claim 12, further comprising a column decoder operably coupled to the columns of the element array and configured to read a column output from each pixel in the read-enabled row corresponding to the state of the pixels in the read-enabled row.

17. The semiconductor imager of claim 16, further comprising a sampling circuit configured for sampling an output signal from the column decoder and converting the sampled output signal to a digital value representing a voltage on the output signal.

18. The semiconductor imager of claim 17, further comprising a logic converter configured for converting the digital value to at least one logical bit representing the multi-value state when the semiconductor imager is operating in the memory mode.

19. The semiconductor imager of claim 17, further comprising a logic converter configured for converting the digital value to at least two logical bits representing more than two different logic states when the semiconductor imager is operating in the memory mode.

20. A method of using an imaging pixel in multiple modes, comprising:
during at least a first time period, using the imaging pixel in a memory mode by:
writing data into the imaging pixel by writing a logic state to a floating diffusion node of the imaging pixel by providing a voltage level corresponding to the logic state on an input signal of the imaging pixel, wherein the logic state that is written to the floating diffusion during memory mode operations includes a first logic state that is written by providing a ground voltage level on the input signal and includes a second logic state that is different from the first logic state that is written by providing a positive voltage level on the input signal; and
reading the data out of the imaging pixel by reading the logic state of the floating diffusion node; and
during at least a second time period, using the imaging pixel in an image mode by:
providing a supply voltage on the input signal;
capturing at least part of an image by collecting electrons generated by radiation impinging on a photo-detector of the imaging pixel;
transferring the collected electrons to the floating diffusion node; and
reading an image state of the floating diffusion node.

21. The method of claim 20, wherein the voltage level corresponding to the logic state comprises a multi-value voltage that is configured to supply more than two different voltage levels to represent a corresponding more than two different logic states.

22. The method of claim 20, further comprising sampling an output signal from reading the logic state or reading the image state and converting the sampled output signal a digital value representing a voltage on the output signal.

23. The method of claim 22, further comprising converting the digital value to at least one logical bit representing the logic state when the imaging pixel is operating in the memory mode.

24. The method of claim 22, further comprising converting the digital value to at least two logical bits representing more than two different logic states when the imaging pixel is operating in the memory mode.

25. The method of claim 20, further comprising generating the voltage level corresponding to the logic state.

26. A method of using an imaging pixel in multiple modes, comprising:
during at least a first time period, writing data into the imaging pixel operating in a memory mode by writing a logic state to a floating diffusion node of the imaging pixel by providing a voltage level corresponding to the logic state on an input signal of the imaging pixel, wherein the logic state that is written to the floating diffusion during memory mode operations includes a first logic value that is written by providing a ground voltage level on the input signal and includes a second logic value that is different from the first logic value that is written by providing a positive voltage level on the input signal;

during at least the first time period, reading the data out of the imaging pixel by reading the logic state of the floating diffusion node of the imaging pixel operating in the memory mode after writing the logic state;

during at least a second time period, providing a supply voltage on the input signal of the imaging pixel operating in an image mode;

during at least the second time period, capturing at least part of an image by collecting electrons generated by radiation impinging on a photo-detector of the imaging pixel operating in the image mode;

during at least the second time period, transferring the collected electrons to the floating diffusion node of the imaging pixel operating in the image mode; and during at least the second time period, reading an image state of the floating diffusion node of the imaging pixel operating in the image mode after transferring the collected electrons.

27. The method of claim 26, further comprising resetting the floating diffusion node with the supply voltage.

28. The method of claim 26, wherein the voltage level corresponding to the logic state comprises a multi-value voltage that is configured to supply more than two different voltage levels to represent a corresponding more than two different logic states.

29. The method of claim 26, further comprising sampling an output signal from reading the logic state or reading the image state and converting the sampled output signal to a digital value representing a voltage on the output signal.

30. The method of claim 29, further comprising converting the digital value to at least one logical bit representing the logic state.

31. The method of claim 29, further comprising converting the digital value to at least two logical bits representing more than two different logic states.

32. An imaging system, comprising:
a semiconductor imager, comprising:
an element array comprising a plurality of pixels arranged in rows and columns, each pixel of the plurality comprising:
a photo-detector configured for collecting electrons generated by radiation impinging thereon;
a transfer gate configured for transferring the collected electrons from the photo-detector to a floating diffusion node when the transfer gate is enabled;
a write circuit configured for receiving and storing a multi-value voltage on the floating diffusion node during a memory mode, wherein the multi-value voltage that is stored on the floating diffusion node during the memory mode includes a ground voltage that represents a first logic state and a positive voltage that represents a second logic state that is different from the first logic state; and
a read circuit configured for reading a state of the floating diffusion node wherein the state corresponds to the amount of transferred electrons or the multi-value voltage; and
a memory operably coupled to the semiconductor imager and configured for storing a digital representation of an image captured by the element array.

33. The imaging system of claim 32, further comprising an optical receiver configured to receive and modify incident light and present the modified light to the element array.

34. The imaging system of claim 32, further comprising:
a processor operably coupled to the semiconductor imager; and
a communication interface operably coupled to the processor and configured for communicating the digital representation to an external device.

* * * * *